United States Patent
Kanai et al.

(10) Patent No.: US 10,877,085 B2
(45) Date of Patent: Dec. 29, 2020

(54) INSPECTION JIG AND INSPECTION DEVICE

(71) Applicant: NIDEC READ CORPORATION, Kyoto (JP)

(72) Inventors: Toshihiko Kanai, Kyoto (JP); Norihiro Ota, Kyoto (JP); Yusuke Yokota, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 0 days.

(21) Appl. No.: 16/307,955

(22) PCT Filed: Apr. 26, 2017

(86) PCT No.: PCT/JP2017/016550
§ 371 (c)(1),
(2) Date: Dec. 7, 2018

(87) PCT Pub. No.: WO2017/212814
PCT Pub. Date: Dec. 14, 2017

(65) Prior Publication Data
US 2019/0302170 A1    Oct. 3, 2019

(30) Foreign Application Priority Data

Jun. 9, 2016 (JP) .................. 2016-115450

(51) Int. Cl.
*G01R 31/26* (2020.01)
*G01R 1/067* (2006.01)
(Continued)

(52) U.S. Cl.
CPC .............. *G01R 31/26* (2013.01); *G01R 1/06* (2013.01); *G01R 1/067* (2013.01);
(Continued)

(58) Field of Classification Search
CPC .......... G01R 1/06716; G01R 1/06722; G01R 1/06727; G01R 1/07328; G01R 31/2601; G01R 31/2886
(Continued)

(56) References Cited

U.S. PATENT DOCUMENTS 3,676,776 A * 7/1972 Bauer ................ G01R 1/07357
324/72.5
5,291,129 A * 3/1994 Kazama ............. G01R 1/06738
324/750.26
(Continued)

FOREIGN PATENT DOCUMENTS

CN   101907642 A   12/2010
JP   S63253271 A   10/1988
(Continued)

OTHER PUBLICATIONS

International Search Report received for International Application No. PCT/JP2017/016550 dated Jul. 18, 2017, 2 pages (Reference Purpose Only).

*Primary Examiner* — Patrick Assouad
*Assistant Examiner* — Demetrius R Pretlow
(74) *Attorney, Agent, or Firm* — Viering, Jentschura & Partner MBB (57) ABSTRACT

An inspection jig may include: an electrode; a probe, the probe having a rear end portion and a tip portion to contact a bump; and a support member supporting the probe. The probe may include: an outer tubular body that is electrically conductive; and an inner tubular body that is electrically conductive, the inner tubular body being inserted into the outer tubular body. The outer tubular body may include outer spring parts to bias the rear end portion. The inner tubular body may include inner spring parts. The tip portion may be a first end of the inner tubular body, and protrudes from a first end of the outer tubular body. The support
(Continued)

member may hold the outer tubular body such that the rear end portion is brought into contact with the electrode by the biasing force of the outer spring parts.

13 Claims, 7 Drawing Sheets

(51) Int. Cl.
    *G01R 31/28*     (2006.01)
    *G01R 1/06*     (2006.01)

(52) U.S. Cl.
    CPC ..... *G01R 1/06722* (2013.01); *G01R 1/06738* (2013.01); *G01R 31/28* (2013.01)

(58) Field of Classification Search
    USPC .......................... 324/754.03, 754.08–754.09, 324/754.12–754.14, 755.01–755.03
    See application file for complete search history.

(56) References Cited

U.S. PATENT DOCUMENTS

| | | | |
|---|---|---|---|
| 5,982,187 A * | 11/1999 | Tarzwell | G01R 1/06722 324/72.5 |
| 6,617,866 B1 | 9/2003 | Ickes | |
| 6,667,628 B2 * | 12/2003 | Ahrikencheikh | G01R 31/2808 324/755.05 |
| 7,091,734 B2 * | 8/2006 | Kazama | C23C 28/023 324/754.14 |
| 9,069,012 B2 | 6/2015 | Yano et al. | |
| 2001/0012704 A1 | 8/2001 | Eldridge | |
| 2003/0137316 A1 | 7/2003 | Kazama | |
| 2004/0113640 A1 | 6/2004 | Cooper et al. | |
| 2013/0033278 A1 | 2/2013 | Ohta et al. | |
| 2013/0057308 A1 * | 3/2013 | Yano | G01R 3/00 324/755.01 |
| 2015/0253356 A1 | 9/2015 | Kuo et al. | |
| 2017/0122978 A1 | 5/2017 | Li et al. | |
| 2017/0192036 A1 | 7/2017 | Tsai et al. | |

FOREIGN PATENT DOCUMENTS

| | | |
|---|---|---|
| JP | 2002520864 A | 7/2002 |
| JP | 2006510028 A | 3/2006 |
| JP | 2006208329 A | 8/2006 |
| JP | 2010204082 A | 9/2010 |
| JP | 2013053931 A | 3/2013 |
| JP | 2014127407 A | 7/2014 |
| JP | 5776687 B2 | 9/2015 |
| JP | 2017120265 A | 7/2017 |
| WO | 2011132613 A1 | 10/2011 |

* cited by examiner

INSPECTION JIG AND INSPECTION DEVICE

CROSS-REFERENCE TO RELATED APPLICATIONS

This application is a national stage entry according to 35 U.S.C. 371 of PCT Application No. PCT/JP2017/016550 filed on Apr. 26, 2017, which claims priority to Japanese Application No. 2016-115450 filed on Jun. 9, 2016, which are entirely incorporated herein by reference.

TECHNICAL FIELD

The present disclosure relates to an inspection jig for contacting an inspection object, and an inspection device including the inspection jig.

BACKGROUND

A probe for an inspection device may have a configuration in which a rod-shaped member formed in a columnar shape is inserted into a cylindrical member having at its middle position a spring part; and an inspection jig including the probe (see, for example, Patent Literature 1). In this probe, the rod-shaped member may be fixedly bonded to the cylindrical member at a position near a tip portion of the cylindrical member such that the rod-shaped member protrudes from the cylindrical member. When a rear end portion of the cylindrical member is brought into contact with an electrode portion, then the rear end portion of the cylindrical member is biased to the electrode portion by the elastic resilience of the spring part. In addition, when a tip portion of the rod-shaped member is brought into contact with an inspection object, then the tip portion of the rod-shaped member is biased to the inspection object by the elastic resilience of the spring part. The contact of the probe with the electrode portion and the inspection object is thus stabilized.

Patent Literature 1: JP 2013-53931 A

SUMMARY

According to the inspection jig described above, in inspection, the spring part exerts the biasing force on both the electrode and the inspection object at the instant when the probe is brought into contact with the inspection object. At this time, variations in contact pressure may cause unstable contact of the probe with the inspection object that is in contact with the probe for the inspection and unstable contact of the probe with the electrode.

The present disclosure provides an inspection jig and an inspection device that facilitate improvement in contact stability of a probe.

An inspection jig according to one aspect of the present disclosure may include: an electrode to be electrically connected to an inspection processing portion configured to electrically inspect a target object to be inspected; a probe formed in a substantially rod shape, the probe having a rear end portion to be brought into contact with the electrode, and a tip portion to be brought into contact with an inspection point on the target object; and a support member supporting the probe. In the inspection jig, the probe may include: an outer tubular body having a tubular shape and that is electrically conductive; and an inner tubular body having a tubular shape and that is electrically conductive, the inner tubular body being inserted into the outer tubular body. The outer tubular body may include an outer spring part configured to expand and contract along an axis of the outer tubular body and configured to bias the rear end portion. The inner tubular body includes an inner spring part configured to expand and contract along an axis of the inner tubular body. The tip portion is a first end of the inner tubular body, and protrudes from a first end of the outer tubular body. The support member holds the outer tubular body such that the rear end portion is brought into contact with the electrode by a biasing force of the outer spring part.

An inspection device according to another aspect of the present disclosure may include: the inspection jig described above; and the inspection processing portion configured to inspect the target object, based on an electric signal from the electrode.

The inspection jig and the inspection device facilitate improvement in contact stability of a probe.

DETAILED DESCRIPTION

Aspects of the present disclosure will be described below based on the drawings. It should be noted that configurations denoted with the same reference sign in the respective drawings are identical to one another; therefore, the description thereof will not be given.

Figure 1:
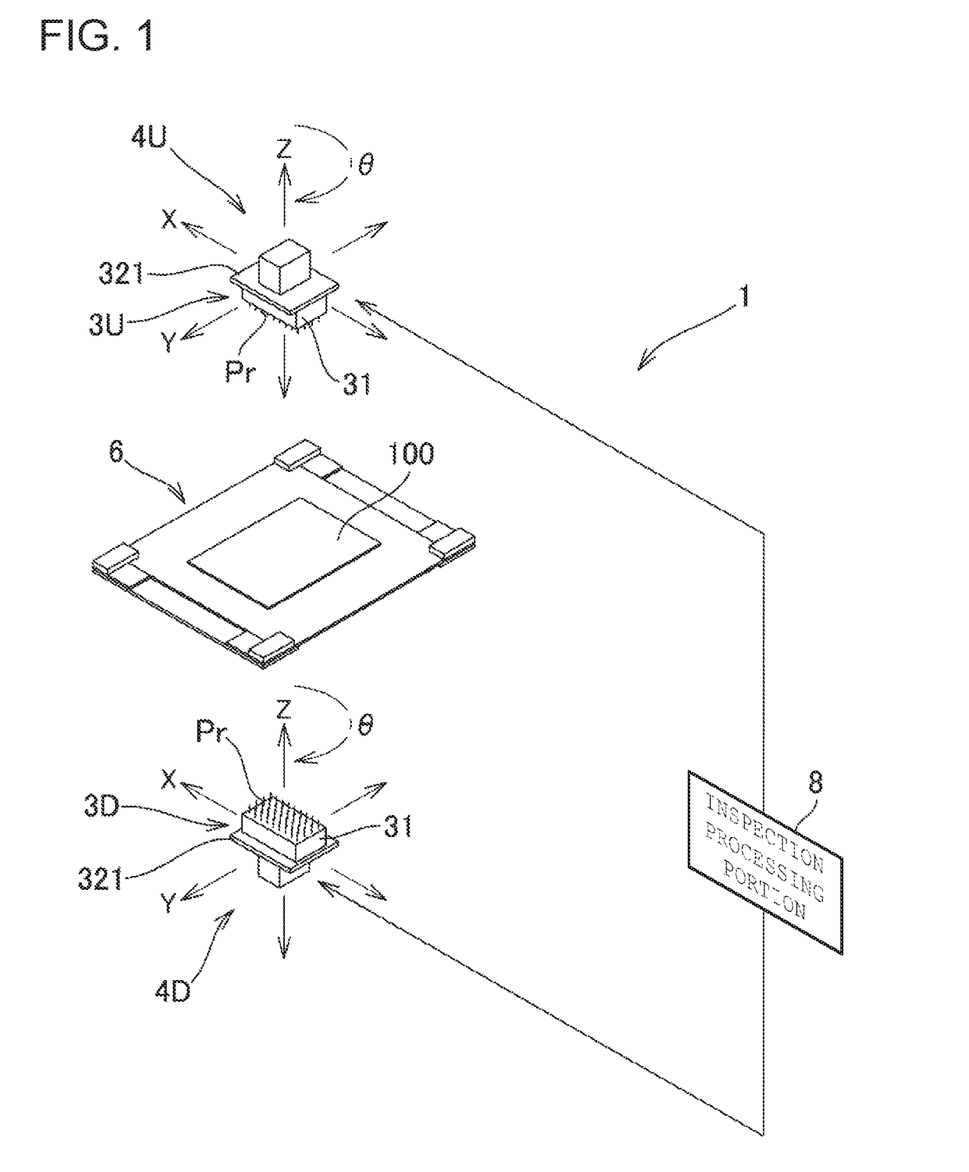
FIG. 1 is a conceptual view schematically illustrating a configuration of a board inspection device including inspection jigs according to a non-limiting aspect of the present disclosure.

FIG. 1 is a conceptual view schematically illustrating a configuration of a board inspection device 1 including inspection jigs according to an non-limiting aspect of the present disclosure. The board inspection device 1 is an example of an inspection device. Each of the inspection jigs 3U and 3D is an example of a contact conduction jig. The board inspection device 1 illustrated in FIG. 1 is a device for inspecting a circuit pattern on a board 100 which is an example of an inspection object.

Examples of the board 100 may include various types of boards such as a printed circuit board; a flexible board; a ceramic multilayer circuit board; an electrode plate for use in a liquid crystal display and a plasma display; a semiconductor substrate; and a package board and a film carrier for use in a semiconductor package. It should be noted that the inspection object is not limited to a board, but may be, for example, an electronic component such as a semiconductor element (e.g., an integrated circuit (IC)) or may be any other object to be subjected to electrical inspection.

The board inspection device 1 illustrated in FIG. 1 includes inspection portions 4U and 4D, a board fixing device 6, and an inspection processing portion 8. The board fixing device 6 is configured to fix the board 100 to be inspected, at a predetermined position. The inspection portions 4U and 4D respectively include the inspection jigs 3U and 3D. The inspection portions 4U and 4D also respectively include driving mechanisms (not illustrated) that cause the inspection jigs 3U and 3D to move along an x axis, a y axis, and a z axis perpendicular to one another and cause the inspection jigs 3U and 3D to rotate about the z axis.

The inspection portion 4U is placed above the board 100 fixed to the board fixing device 6. The inspection portion 4D is placed below the board 100 fixed to the board fixing device 6. The inspection portions 4U and 4D respectively include the inspection jigs 3U and 3D detachable therefrom and configured to inspect the circuit pattern on the board 100. Hereinafter, the inspection portions 4U and 4D will be collectively referred to as an inspection portion 4 as appropriate.

Figure 3:
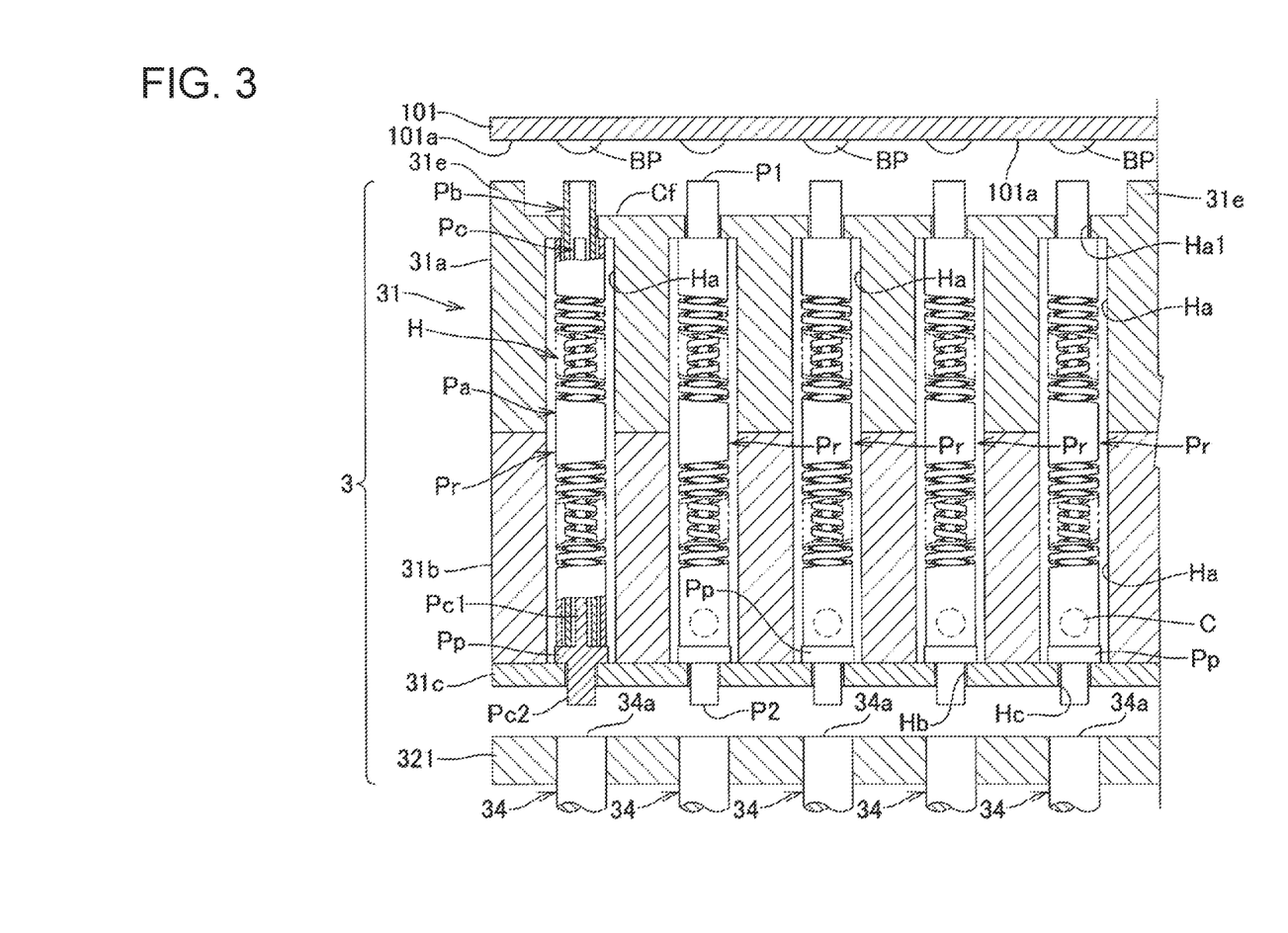
FIG. 3 is a schematic sectional view illustrating an example of a configuration of an inspection jig illustrated in FIGS. 1 and 2.

Each of the inspection jigs 3U and 3D includes: a plurality of probes Pr (tubular bodies) each having a tip portion P1 and a rear end portion P2; a support member 31 holding the probes Pr with the tip portions P1 directed to the board 100; and a base plate 321 (see FIG. 3). Each of the base plates 321 is provided with electrodes 34*a* that conduct by contact with the rear end portions P2 of the probes Pr. Each of the inspection portions 4U and 4D includes a connection circuit (not illustrated) for electrically connecting the rear end portions P2 of the probes Pr to the inspection processing portion 8 via the electrodes 34*a* in the base plate 321 and switching among the connections.

Each of the probes Pr has a substantially rod shape as a whole. A specific configuration of each probe Pr will be described in detail below. The support member 31 has a plurality of through holes for supporting the probes Pr. The through holes are formed at positions corresponding to positions of inspection points defined on a wiring pattern on the board 100 to be inspected. With this configuration, the tip portions P1 of the probes Pr are brought into contact with inspection points on the board 100. For example, the probes Pr are disposed on intersections in a grid. The sides of the grid respectively extend along the x axis and the y axis perpendicular to each other. Examples of the inspection points may include a wiring pattern, a solder bump, and a connection terminal.

The inspection jigs 3U and 3D are similar in configuration to each other, except for the following respects. Firstly, the probes Pr on the inspection jig 3U are different in arrangement from the probes Pr on the inspection jig 3D. Secondly, the inspection jig 3U is disposed below the inspection portion 4U, whereas the inspection jig 3D is disposed above the inspection portion 4D. Hereinafter, the inspection jigs 3U and 3D will be collectively referred to as an inspection jig 3 as appropriate. The inspection jig 3 is replaceable in accordance with the board 100 to be inspected.

The inspection processing portion 8 includes, for example, a power supply circuit, a voltmeter, an ammeter, and a microcomputer. The inspection processing portion 8 controls the driving mechanisms (not illustrated) to move and position the inspection portions 4U and 4D and to bring the tip portions of the probes Pr into contact with the inspection points on the board 100. With this configuration, the inspection processing portion 8 is electrically connected to the inspection points. In this state, the inspection processing portion 8 feeds a current or voltage for inspection to the inspection points on the board 100 via the probes Pr of the inspection jig 3, and inspects the board 100 for, for example, a disconnection or a short circuit on the circuit pattern, based on a voltage signal or current signal from each of the probes Pr. Alternatively, the inspection processing portion 8 may feed an alternating current or voltage to the inspection points, thereby measuring impedance to be inspected, based on a voltage signal or current signal from each of the probes Pr.

Figure 2:
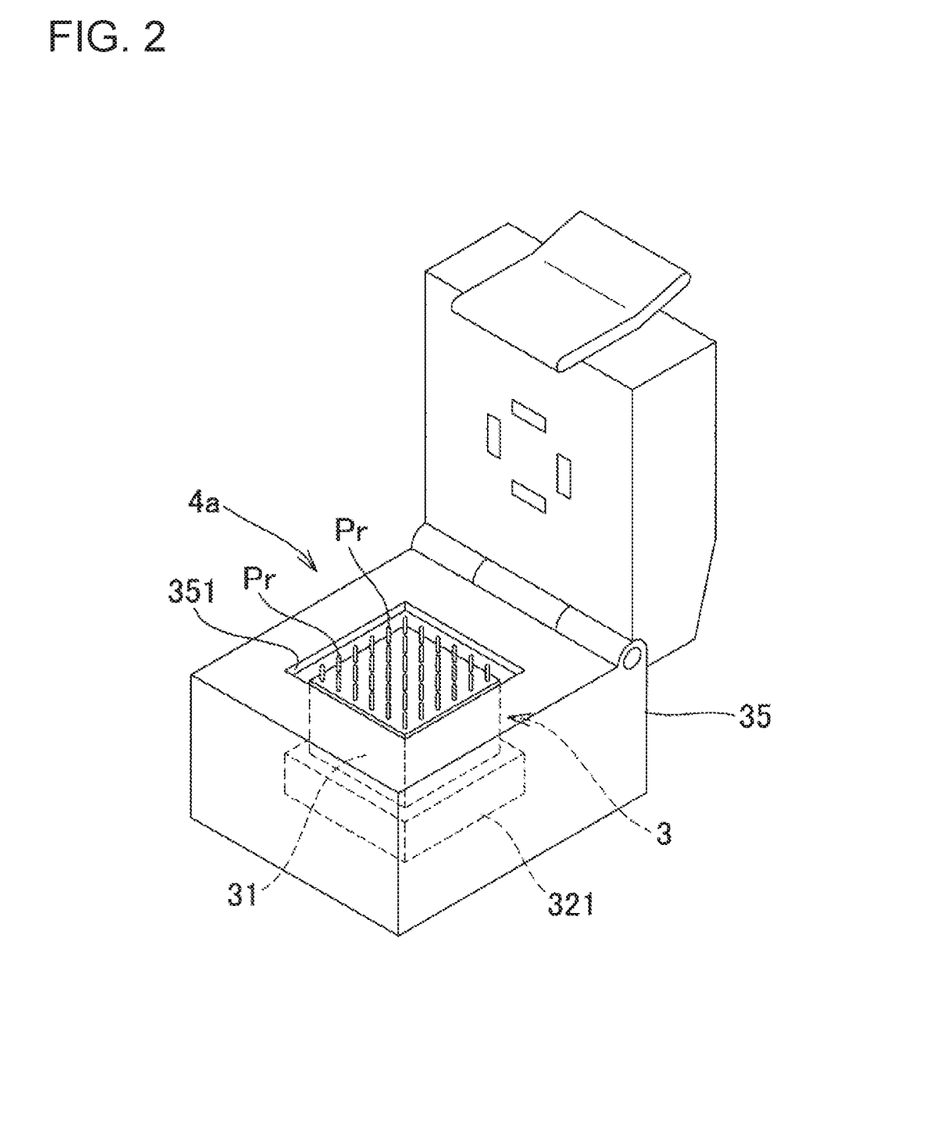
FIG. 2 is a perspective view illustrating another example of an inspection portion illustrated in FIG. 1.

FIG. 2 is a perspective view illustrating another example of the inspection portion 4 illustrated in FIG. 1. An inspection portion 4*a* illustrated in FIG. 2 includes a so-called IC socket 35 and an inspection jig 3 installed in the IC socket 35. The inspection portion 4*a* does not include a driving mechanism, unlike the inspection portion 4, and probes Pr are brought into contact with pins, bumps, or electrodes on an IC mounted on the IC socket 35. An inspection device that includes the inspection portion 4*a* rather than the inspection portions 4U and 4D illustrated in FIG. 1 may serve as an IC inspection device for inspecting a semiconductor element (e.g., an IC) which is an example of an inspection object.

FIG. 3 is a schematic sectional view illustrating an example of a configuration of the inspection jig 3 illustrated in FIGS. 1 and 2. The inspection jig 3 illustrated in FIG. 3 is installed in the inspection portion 4*a* illustrated in FIG. 2, and an inspection object illustrated in FIG. 3 is a semiconductor element 101.

The support member 31 illustrated in FIG. 3 includes a stack of support plates 31*a*, 31*b*, and 31*c* each having a plate shape, for example. The support plate 31*c* is on a rear end side of the support member 31, and the support plate 31*a* is on a tip side of the support member 31. The support member 31 has a plurality of through holes H penetrating the support plates 31*a*, 31*b*, and 31*c*.

The through holes in the support plates 31*a* and 31*b* include hole portions Ha. The through holes in the support plate 31*c* include narrow portions Hb. The support plate 31*a* has a surface opposite to the semiconductor element 101 (target object), and this surface is referred to as an opposed surface Cf. The through holes in the support plate 31*a* also include decreased diameter portions Ha1 of which the hole diameter is decreased. The decreased diameter portions Ha1 are on a side of the opposed surface Cf where the hole portions Ha are open, that is, on tip sides of the hole portions Ha. The hole portions Ha and the narrow portions Hb communicate with each other to form the through holes H.

The semiconductor element 101 includes a target object surface 101*a*, and bumps BP (inspection points) protruding from the opposed surface Cf. Each of the bumps BP may have a substantially spherical shape. The support member 31 includes protrusion portions 31*e* protruding from the opposed surface Cf so as to interfere with the target object surface 101*a*. The number of protrusion portions 31*e* is at least two, e.g., three or more in order to prevent collision of the target object surface 101*a* with the opposed surface Cf.

The structure of the support member 31 is not limited to the stack of support plates 31*a*, 31*b*, and 31*c* each having a plate shape. For example, the support member may be formed of a monolithic member having hole portions Ha and narrow portions Hb that form through holes H. In addition, the through holes H do not necessarily include the narrow portions Hb, but may include the hole portions Ha as a whole. In addition, the decreased diameter portions Ha1 are not necessarily formed on the hole portions Ha. In the support member, the support plates 31*a* and 31*b* are stacked.

Alternatively, the support plate 31a and the support plate 31b may be separated from each other with, for example, a post interposed therebetween such that this post supports the support plate 31a and the support plate 31b.

The support plate 31c has a rear end (lower side in FIG. 3) to be mounted on the base plate 321 that is made of, for example, an insulating resin material. For convenience of the description, FIG. 3 illustrates the support plate 31c that is not mounted on the base plate 321 yet.

When the support plate 31c is mounted on the base plate 321, rear end-side opening portions Hc of the through holes H are closed with the base plate 321. In the base plate 321, wires 34 are disposed at positions opposite to the rear end-side opening portions Hc so as to penetrate the base plate 321. A surface of the base plate 321 opposite to the support plate 31c is made flush with end faces of the wires 34 exposed to the surface. The end faces of the wires 34 form the electrodes 34a.

The probes Pr are respectively inserted into the through holes H. Each of the probes Pr includes: an outer tubular body Pa having a tubular shape and that is electrically conductive; an inner tubular body Pb having a tubular shape and that is electrically conductive, the inner tubular body Pb being inserted into the outer tubular body Pa; and a central conductor Pc having a rod shape and that is electrically conductive, the central conductor Pc being inserted into the inner tubular body Pb.

Figure 4:
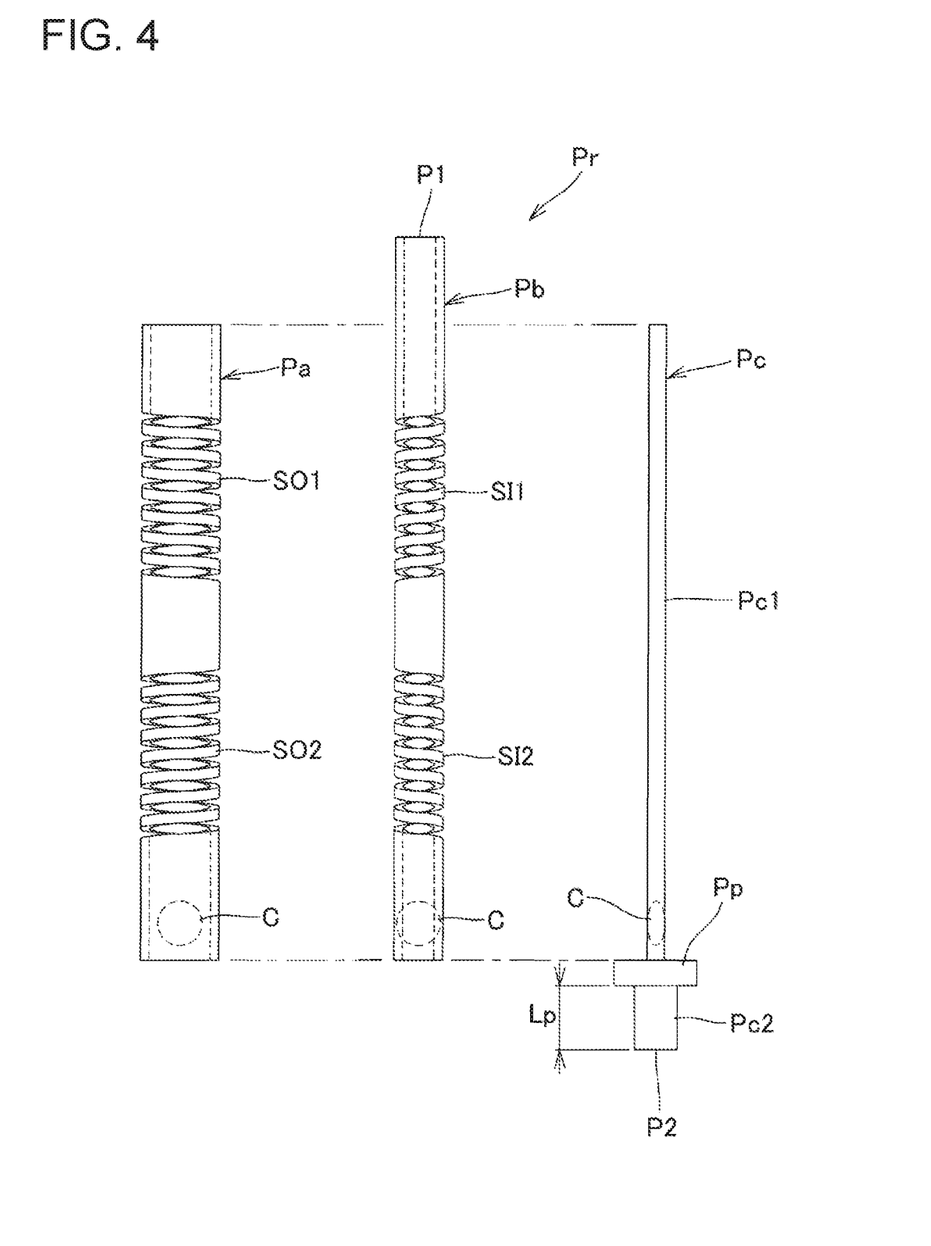
FIG. 4 is a plan view illustrating a probe disassembled into an outer tubular body, an inner tubular body, and a central conductor.

FIG. 4 is a plan view illustrating one of the probes Pr disassembled into the outer tubular body Pa, the inner tubular body Pb, and the central conductor Pc. The outer tubular body Pa includes: an outer first spring part SO1 wound helically in a first direction and configured to expand and contract along an axis of the outer tubular body Pa; and an outer second spring part SO2 wound helically in a second direction opposite to the first direction. The outer first spring part SO1 is substantially equal in number of turns and line width to the outer second spring part SO2.

The outer tubular body Pa has an outer diameter larger than an inner diameter of the decreased diameter portion Ha1. This configuration prevents the probe Pr in the through hole H from falling off the decreased diameter portion Ha1.

The inner tubular body Pb includes: an inner first spring part SI1 wound helically in the second direction and configured to expand and contract along an axis of the inner tubular body Pb; and an inner second spring part SI2 wound helically in the first direction. The inner first spring part SI1 is substantially equal in number of turns and line width to the inner second spring part SI2. The tip portion P1 of the probe Pr is a tip portion P1 of the inner tubular body Pb.

The inner tubular body Pb has an outer diameter smaller than an inner diameter of the outer tubular body Pa. Therefore, the inner tubular body Pb is insertable into the outer tubular body Pa. Moreover, the inner tubular body Pb is longer in length than the outer tubular body Pa. Each of the outer tubular body Pa and the inner tubular body Pb may be made of, for example, nickel or a nickel alloy.

The spring parts, such as the inner first spring part SI1, the inner second spring part SI2, the outer first spring part SO1, and the outer second spring part SO2, may be formed by any method. For example, these spring parts may be formed in such a manner that a helical slit is formed by etching in a peripheral wall of a tubular member. For example, these spring parts may be formed in such a manner that a helical slit is formed by electroforming in a peripheral wall of a tubular member. For example, these spring parts may be formed by a so-called three-dimensional metal printer. For example, these spring parts may be formed by photolithography. As described above, various manufacturing methods may be employed for forming the spring parts.

The central conductor Pc includes: a central conductor main body portion Pc1; and a central conductor increased diameter portion Pc2 larger in thickness than the central conductor main body portion Pc1. Each of the central conductor main body portion Pc1 and the central conductor increased diameter portion Pc2 has a substantially columnar shape. A protrusion portion Pp is provided at a position of a boundary between the central conductor main body portion Pc1 and the central conductor increased diameter portion Pc2 so as to extend in a flange shape around the boundary. The central conductor main body portion Pc1 is inserted into the inner tubular body Pb.

The central conductor increased diameter portion Pc2 has a diameter smaller than an inner diameter of the narrow portion Hb. The protrusion portion Pp has a diameter larger than the inner diameter of the narrow portion Hb. In addition, the diameter of the protrusion portion Pp is equal to or more than the outer diameter of the outer tubular body Pa. The central conductor Pc is suitably made of, for example, a palladium alloy to which solder is less likely to be applied.

A difference between the inner diameter of the outer tubular body Pa and the outer diameter of the inner tubular body Pb is set to be considerably small. In addition, a difference between the inner diameter of the inner tubular body Pb and the outer diameter of the central conductor Pc is also set to be considerably small. Consequently, the outer tubular body Pa, the inner tubular body Pb, and the central conductor Pc are brought into contact with one another in a slidable manner, and are brought into electrical conduction.

The outer tubular body Pa, the inner tubular body Pb, and the central conductor main body portion Pc1 are connected by, for example, welding in the vicinity of their rear ends, that is, at connection points C near the protrusion portion Pp. The outer tubular body Pa, the inner tubular body Pb, and the central conductor main body portion Pc1 may be connected at the connection points C by, for example, electric welding (electric resistance welding). Alternatively, the outer tubular body Pa, the inner tubular body Pb, and the central conductor main body portion Pc1 may be connected by any method such as crimping.

It should be noted that the outer tubular body Pa, the inner tubular body Pb, and the central conductor main body portion Pc1 are not necessarily connected to one another at the connection points C as long as at least the inner tubular body Pb and the central conductor main body portion Pc1 are brought into electrical conduction. In addition, the positions where the outer tubular body Pa, the inner tubular body Pb, and the central conductor main body portion Pc1 are connected are not limited to the connection points C as long as the positions are located in the vicinity of the rear ends of the outer tubular body Pa, inner tubular body Pb, and central conductor main body portion Pc1. The outer tubular body Pa, the inner tubular body Pb, and the central conductor main body portion Pc1 may be electrically connected to one another in the following manner. For example, the end of the inner tubular body Pb is brought into contact with the protrusion portion Pp, so that the inner tubular body Pb and the central conductor main body portion Pc1 are brought into contact with each other and are brought into electrical conduction.

In connecting the outer tubular body Pa, the inner tubular body Pb, and the central conductor main body portion Pc1 to one another at the connection points C, the central conductor main body portion Pc1 is inserted into the outer tubular body Pa and the inner tubular body Pb, and the rear ends of the outer tubular body Pa and inner tubular body Pb are abutted against the protrusion portion Pp. Thus, the outer tubular body Pa, the inner tubular body Pb, and the central conductor main body portion Pc1 are positioned in an appropriate positional relationship. This configuration reduces variations in position of the connection points C where the outer tubular body Pa, the inner tubular body Pb, and the central conductor main body portion Pc1 are connected to one another, in a manufacturing process of manufacturing the plurality of probes Pr. As described above, the protrusion portion Pp is used for positioning of the outer tubular body Pa, the inner tubular body Pb, and the central conductor main body portion Pc1, in a process of connecting the outer tubular body Pa, the inner tubular body Pb, and the central conductor main body portion Pc1 to one another at the connection points C.

In addition, a length Lp from a rear end-side surface of the protrusion portion Pp to the rear end portion P2 is set to be slightly larger than a thickness of the support plate 31c. Therefore, the outer tubular body Pa and the inner tubular body Pb, into which the central conductor Pc is inserted, are stopped at the protrusion portion Pp. Consequently, the central conductor increased diameter portion Pc2 of the central conductor Pc in the narrow portion Hb slightly protrudes from the support plate 31c. In addition, the probe Pr in the through hole H is prevented from falling off the narrow portion Hb.

Figure 5:
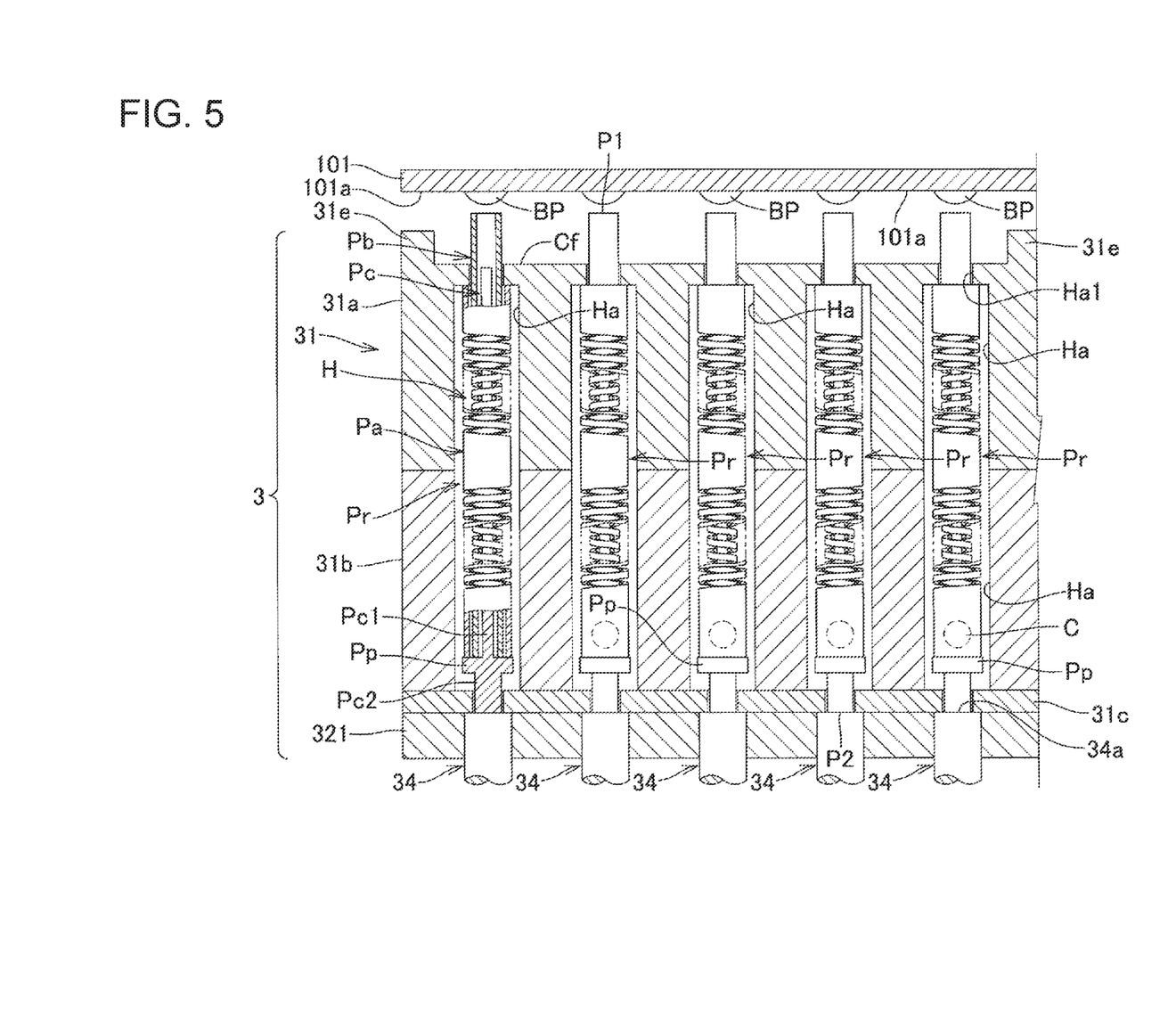
FIG. 5 is a schematic sectional view illustrating an example of a configuration of the inspection jig of which a support plate is mounted on a base plate.
Figure 6:
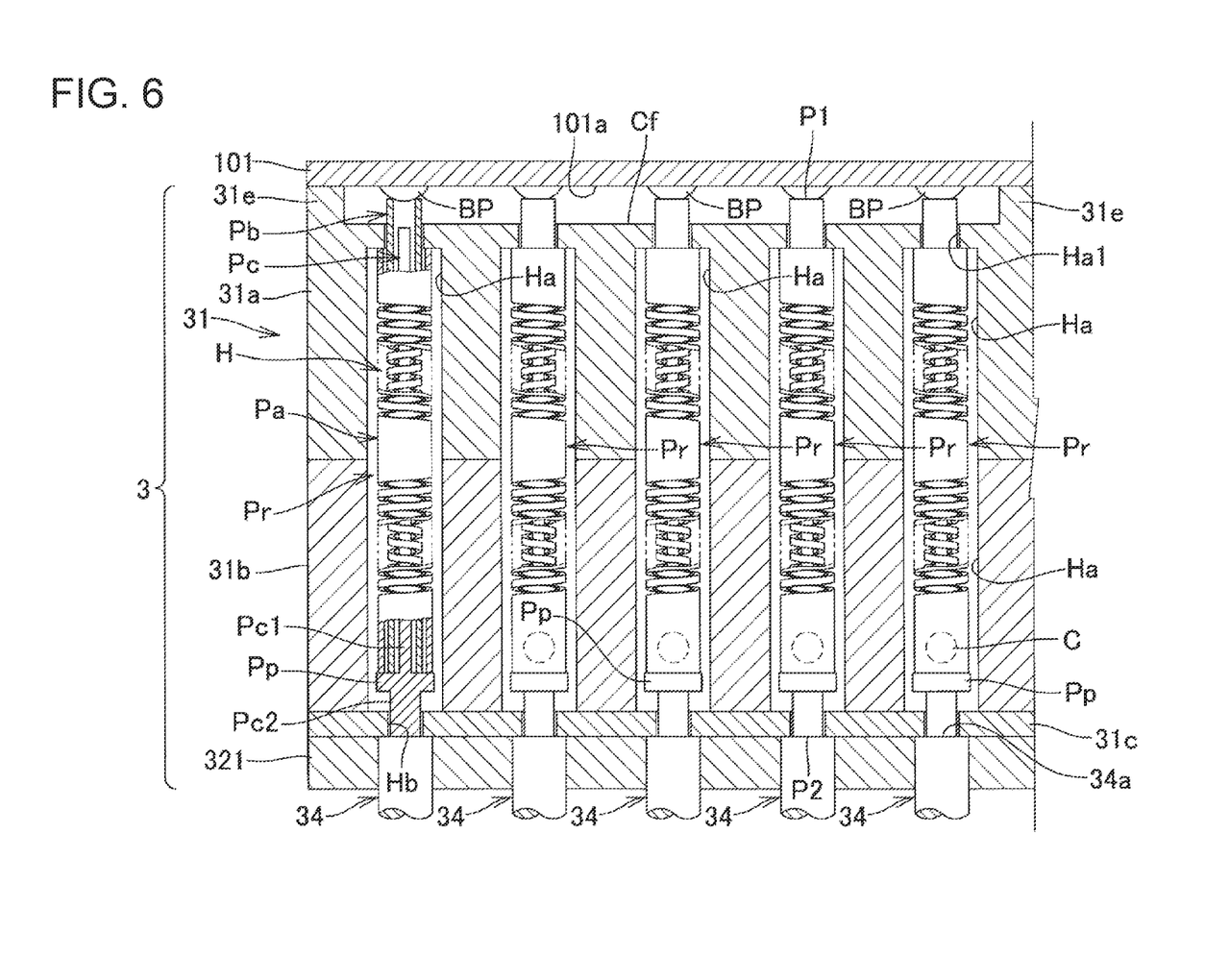
FIG. 6 is a schematic sectional view illustrating a state in which the inspection jig illustrated in FIG. 5 is in contact with a semiconductor element in order to inspect the semiconductor element.

FIG. 5 is a schematic sectional view illustrating an example of a configuration of the inspection jig 3 of which the support plate 31c is mounted on the base plate 321. FIG. 6 is a schematic sectional view illustrating a state in which the inspection jig 3 illustrated in FIG. 5 is in contact with the semiconductor element 101 in order to inspect the semiconductor element 101.

In the state in which the support plate 31c is not mounted on the base plate 321, each central conductor increased diameter portion Pc2 slightly protrudes from the support plate 31c. Therefore, when the support plate 31c is mounted on the base plate 321, the rear end portion P2 of each central conductor increased diameter portion Pc2, that is, the rear end portion P2 of each central conductor Pc is brought into contact with the corresponding electrode 34a in the base plate 321. Thus, the electrode 34a pushes the protruding central conductor increased diameter portion Pc2 into the support member 31 against the biasing force of the corresponding outer first spring part SO1 and outer second spring part SO2.

Consequently, the rear end portion P2 of each probe Pr is brought into press-contact with the corresponding electrode 34a by the biasing force of the outer first spring part SO1 and outer second spring part SO2. Thus, the rear end portion P2 of the probe Pr and the electrode 34a are stably brought into electrical conduction. Moreover, the rear end portion P2 of the probe Pr is stably brought into contact with the electrode 34a.

The rear end portions P2 are made substantially flat. The electrodes 34a are also substantially flat. Therefore, when each rear end portion P2 that is substantially flat is brought into press-contact with the corresponding electrode 34a that is also substantially flat, the flat surfaces come into contact with each other. This results in an increase of a contact area, and also results in a reduction of contact resistance between each probe Pr and the corresponding electrode 34a. In other words, as in the case of the probe described in the BACKGROUND section, when the rear end portion of the cylindrical member is brought into contact with the electrode, the rear end portion of the cylindrical member is in contact with the electrode in a ring shape. In contrast to this, according to the inspection jig 3, the rear end portion P2, which is flat, of each central conductor increased diameter portion Pc2, which is formed in a substantially columnar shape, is in surface-contact with the corresponding electrode 34a. Therefore, the inspection jig 3 is superior in an increase of a contact area to that described in the BACKGROUND section.

In each of the probes Pr, the central conductor increased diameter portion Pc2 is larger in diameter than the central conductor main body portion Pc1. Therefore, this configuration leads to an increase of a contact area between the probe Pr and the corresponding electrode 34a as compared with a configuration in which the central conductor increased diameter portion Pc2 is equal in thickness to the central conductor main body portion Pc1. It should be noted that the central conductor increased diameter portion Pc2 is not necessarily larger in diameter than the central conductor main body portion Pc1. For example, the central conductor increased diameter portion Pc2 may be equal in thickness to the central conductor main body portion Pc1.

The shape of the rear end portion P2 is not limited to a flat shape. Examples of the shape may include various shapes such as a crown shape, a semispherical shape, a conical shape, and a truncated shape. The rear end portion P2 of each probe Pr is the rear end portion P2 of the central conductor Pc.

In addition, each of the outer tubular body Pa, the inner tubular body Pb, and the central conductor Pc may be entirely or partially gold-plated, for example. This configuration improves certainty of electrical conduction of the outer tubular body Pa, inner tubular body Pb, and central conductor Pc.

For example, a length of each probe Pr not contracting, that is, a length from the rear end portion P2 to the tip portion P1 of the inner tubular body Pb may be set at 10 mm to 30 mm, e.g., about 20 mm. For example, a thickness of each probe Pr, that is, an outer diameter of the outer tubular body Pa may be set at about 25 to 300 μm, e.g., about 100 μm. The outer tubular body Pa is shorter than the inner tubular body Pb such that the outer tubular body Pa is stopped at the decreased diameter portion Ha1. A length of the central conductor Pc is set such that the tip portion of the central conductor Pc is not brought into contact with the corresponding bump BP (inspection point) when the semiconductor element 101 (target object) is brought into contact with the support plate 31a in the state in which the support plate 31c is mounted on the base plate 321, and the electrode 34a pushes the rear end portion P2 into the narrow portion Hb against the biasing force based on the spring pressure of the outer tubular body Pa and inner tubular body Pb (see the leftmost probe Pr in FIG. 6).

A length of each hole portion Ha, that is, a distance between a tip-side surface of the support plate 31c and the opposed surface Cf is shorter than a length corresponding to a sum of a natural length of the inner tubular body Pb not contracting and a thickness of the protrusion portion Pp. Thus, the tip portion P1 of each inner tubular body Pb in the corresponding through hole H protrudes from the opposed surface Cf.

The protrusion portions 31e protrude from the opposed surface Cf by a length longer than the length of each bump BP protruding from the target object surface 101a. Moreover, the protrusion portions 31e protrude from the opposed surface Cf by a length shorter than a sum of the length of each tip portion P1 protruding from the opposed surface Cf and the length of each bump BP protruding from the target object surface 101a.

With this configuration, when the inspection jig 3 is brought into contact with the semiconductor element 101 in order to inspect the semiconductor element 101, since the length of the protrusion portions 31e protruding from the opposed surface Cf is longer than the length of each bump BP protruding from the target object surface 101a, the protrusion portions 31e interfere with the target object surface 101a, so that the bump BP is prevented from colliding with the opposed surface Cf. This results in suppression of damage to each bump BP in inspection.

In addition, the length of the protrusion portions 31e protruding from the opposed surface Cf is shorter than the sum of the length of each tip portion P1 protruding from the opposed surface Cf and the length of each bump BP protruding from the target object surface 101a. Therefore, when the protrusion portions 31e are brought into contact with the target object surface 101a, each bump BP pushes the corresponding tip portion P1. Consequently, the inner first spring part SI1 and the inner second spring part SI2 contract, so that the tip portion P1 is brought into press-contact with the bump BP by the biasing force of the inner first spring part SI1 and inner second spring part SI2. This enables stable electrical conduction of the bump BP and the tip portion P1 of the probe Pr, and also enables stable contact of the tip portion P1 of the probe Pr with the bump BP.

According to this configuration, the elastic resilience of the outer first spring part SO1 and outer second spring part SO2 is used for press-contact of the rear end portion P2 with the electrode 34a. In addition, the elastic resilience of the inner first spring part SI1 and inner first spring part SI2 is used for press-contact of the tip portion P1 with the bump BP. In the inspection jig 3, consequently, the spring for press-contact of each probe Pr with the electrode 34a is different from the spring for press-contact of the probe Pr with the bump BP in inspection. Therefore, this configuration reduces variations in pressure by press-contact of the probe Pr with the electrode 34a, the pressure being generated at the instant when the probe Pr is brought into contact with the bump BP in inspection. This configuration accordingly facilitates improvement in contact stability of the probe Pr.

In addition, since the tip portion P1 is the first end of the inner tubular body Pb, the tip portion P1 has a ring-shaped end face. Since the bump BP has a substantially spherical shape, when the tip portion P1 is brought into contact with the bump BP, the bump BP, which is a spherical shape, is fitted to the tip portion P1, which is a ring shape. This configuration improves stability in contact of the probe Pr with the bump BP.

With this configuration, the bump BP and the probe Pr are brought into conduction, and the probe Pr and the electrode 34a are brought into conduction. Therefore, the bump BP is electrically connected to the inspection processing portion 8 via the wire 34.

In expansion and contraction, each of the outer first spring part SO1 and the outer second spring part SO2 tends to turn around its axis in relation to the expansion and contraction. In bringing the probe Pr into press-contact with the corresponding inspection point or in separating the probe Pr from the inspection point, therefore, each of the outer first spring part SO1 and the outer second spring part SO2 contracts or expands to generate a force causing the outer tubular body Pa including the outer first spring part SO1 and outer second spring part SO2 to rotate about its axis.

The outer first spring part SO1 and the outer second spring part SO2 are wound in opposite directions, are substantially equal in line width at a spring portion (helical portion) to each other, and are substantially equal in number of turns to each other. Therefore, a rotational force from the outer first spring part SO1 and a rotational force from the outer second spring part SO2 are opposite in direction to each other and are substantially equal in magnitude to each other. Consequently, the rotational force from the outer first spring part SO1 and the rotational force from the outer second spring part SO2 are offset, so that the rotation of the outer tubular body Pa is suppressed.

Likewise, the inner first spring part SI1 and the inner second spring part SI2 are wound in opposite directions, are substantially equal in line width at a spring portion (helical portion) to each other, and are substantially equal in number of turns to each other. Consequently, the force of the inner first spring part SI1, the force being generated in expansion and contraction to rotate the inner tubular body Pb and the force of the inner second spring part SI2, the force being generated in expansion and contraction to rotate the inner tubular body Pb are offset, so that the rotation of the inner tubular body Pb is suppressed.

As described above, the suppression of the rotation of the outer tubular body Pa and inner tubular body Pb enables reduction of movement of the probe Pr, the movement being caused when the probe Pr is brought into contact with the inspection point. Consequently, the probe Pr is brought into contact with the inspection point in a stable manner. Therefore, variations in contact resistance of the probe Pr with the inspection point are reduced. Consequently, stability in inspection and accuracy of inspection are improved.

In the state in which the outer tubular body Pa and the inner tubular body Pb are assembled into the probe Pr, the outer first spring part SO1 and the inner first spring part SI1 are disposed facing each other. In addition, the outer first spring part SO1 is substantially equal in number of turns to the inner first spring part SI1. Likewise, the outer second spring part SO2 and the inner second spring part SI2 are disposed facing each other. In addition, the outer second spring part SO2 is substantially equal in number of turns to the inner second spring part SI2.

The outer first spring part SO1 is wound in the first direction, and the inner first spring part SI1 is wound in the second direction. In other words, the outer first spring part SO1 and the inner first spring part SI1, which are disposed opposite each other, are wound in opposite directions. In addition, the spring parts, which are disposed opposite each other, are substantially equal in number of turns to each other.

Hence, a magnetic field to be generated on the outer first spring part SO1 when an electric current flows through the probe Pr is opposite in direction to a magnetic field to be generated on the inner first spring part SI1 when an electric current flows through the probe Pr. In addition, the two magnetic fields are substantially equal in intensity to each other. Consequently, the magnetic field on the outer first spring part SO1 and the magnetic field on the inner first spring part SI1 are offset.

The outer second spring part SO2 is wound in the second direction, and the inner second spring part SI2 is wound in the first direction. In other words, the outer second spring part SO2 and the inner second spring part SI2, which are disposed opposite each other, are wound in opposite directions. In addition, the spring parts, which are disposed opposite each other, are substantially equal in number of turns to each other.

Hence, a magnetic field to be generated on the outer second spring part SO2 when an electric current flows through the probe Pr is opposite in direction to a magnetic field to be generated on the inner second spring part SI2 when an electric current flows through the probe Pr. In addition, the two magnetic fields are substantially equal in intensity to each other. Consequently, the magnetic field on the outer second spring part SO2 and the magnetic field on the inner second spring part SI2 are offset.

As described above, the magnetic fields on the spring parts of the probe Pr are offset and reduced. Therefore, the probe Pr enables reduction of generation of a magnetic field in inspection. A magnetic field to be generated on a probe in inspection affects the board 100 to be inspected, which may cause reduction in inspection accuracy. In addition, magnetic fields that may be generated on adjacent probes mutually affect the probes, which may cause reduction in inspection accuracy. However, the probe Pr suppresses generation of a magnetic field in inspection, and therefore suppresses reduction in inspection accuracy due to an influence of a magnetic field.

In subjecting the board 100 to impedance measurement, occasionally, the inspection processing portion 8 feeds an alternating current to the probe Pr. In this case, the helical spring acts as a coil. In the probe Pr, however, the magnetic field on the outer first spring part SO1 and the magnetic field on the inner first spring part SI1 are offset. In addition, the magnetic field on the outer second spring part SO2 and the magnetic field on the inner second spring part SI2 are offset. Consequently, an inductance component in the entire probe Pr is reduced. This configuration reduces a possibility that the spring part degrades impedance measurement accuracy using the probe Pr.

Figure 7:
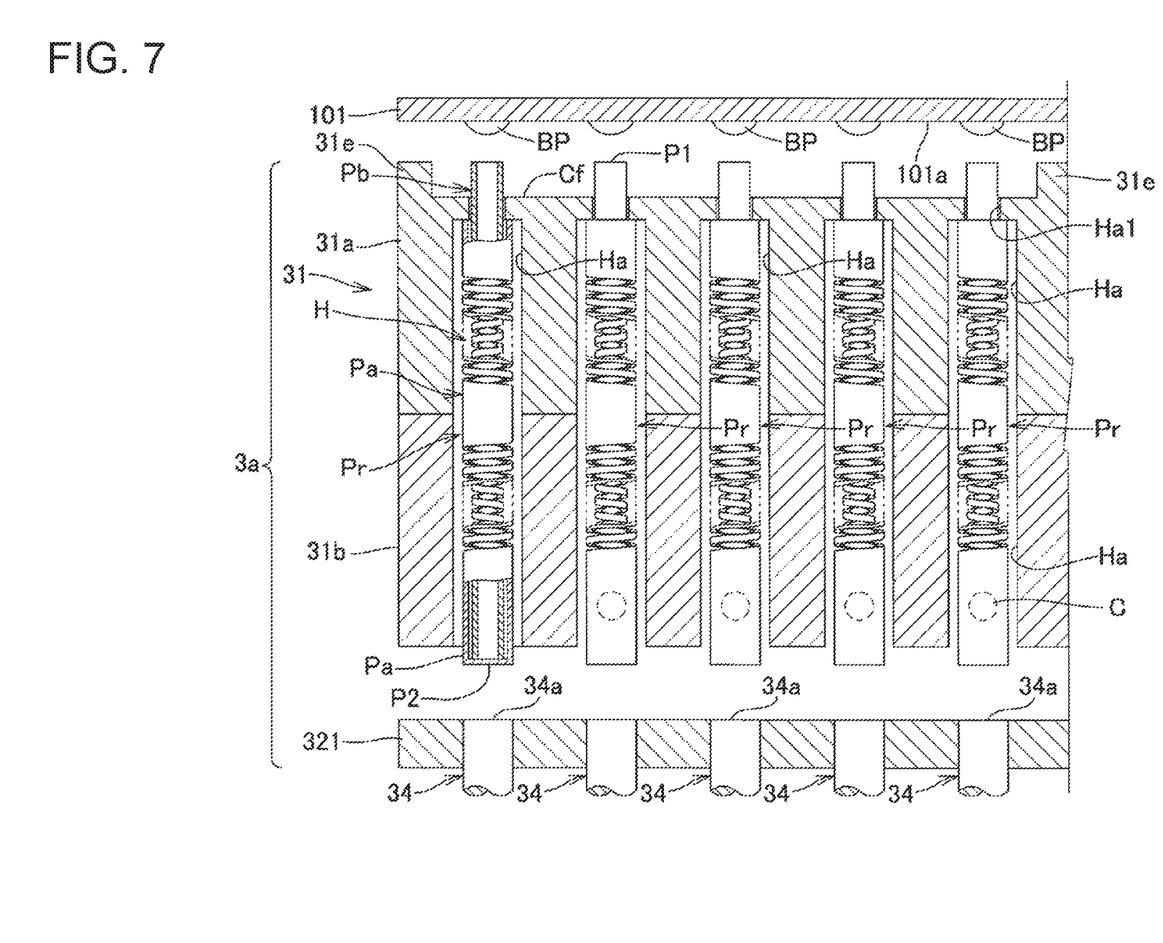
FIG. 7 is a schematic sectional view illustrating an example of a configuration of an inspection jig according to another non-limiting aspect of the present disclosure.

FIG. 7 is a schematic sectional view illustrating an example of a configuration of an inspection jig 3a according to another non-limiting aspect of the disclosure. FIG. 7 is similar to FIG. 3 and illustrates a support member 31 that is not mounted on a base plate 321, for convenience of the description. The inspection jig 3a is used instead of the inspection jig 3 in each of the inspection portion 4 illustrated in FIG. 1 and the inspection portion 4a illustrated in FIG. 2.

The inspection jig 3a is different from the inspection jig 3 in the following respect. That is, the inspection jig 3a does not include the central conductor Pc, and a rear end portion P2 of a probe Pr is a rear end portion of an outer tubular body Pa. The inspection jig 3a is substantially similar in configuration to the inspection jig 3 illustrated in FIGS. 3 to 6 except for this respect; therefore, the description of the similar configuration will not be given here, but a description will be given of characteristic features of the inspection jig 3a.

The support member 31 of the inspection jig 3a does not include a support plate 31c; therefore, a rear end face of a support plate 31b is mounted on the base plate 321. In a state in which the support member 31 is not mounted on the base plate 321, that is, in a state in which an outer first spring part SO1 and an outer second spring part SO2 do not contract, a length of an outer tubular body Pa is longer than a length from a rear end-side end portion of a decreased diameter portion Ha1 to the rear end face of the support plate 31b, and a rear end portion P2 of the outer tubular body Pa protrudes from the rear end face of the support plate 31b.

Therefore, when the support plate 31b is mounted on the base plate 321, an electrode 34a in the base plate 321 pushes the rear end portion P2 into the support member 31 against the biasing force of the outer first spring part SO1 and outer second spring part SO2. Consequently, the rear end portion P2 of each probe Pr is brought into press-contact with the electrode 34a by the biasing force of the outer first spring part SO1 and outer second spring part SO2. The inspection jig 3a enables, like the inspection jig 3, stable electrical conduction of the rear end portion P2 of the probe Pr and the electrode 34a and stable contact of the rear end portion P2 of the probe Pr with the electrode 34a.

The rear end portion P2 of the outer tubular body Pa is a flat face extending in a planar shape so as to close an open end of the tube, and this flat face is brought into surface-contact with the electrode 34a. The flat face of the rear end portion P2 may be formed by any direction. For example, the flat face of the rear end portion P2 may be formed in such a manner that the rear end of the outer tubular body Pa is covered with a conductive and cap-shaped member. Alternatively, the flat face of the rear end portion P2 may be formed in such a manner that the rear end of the outer tubular body Pa is melted and sealed by, for example, electric welding. The outer tubular body Pa and the inner tubular body Pb are connected to each other at connection points C near the rear ends thereof by a connecting method similar to that for the inspection jig 3. Alternatively, the outer tubular body Pa and the inner tubular body Pb may be electrically connected to each other in such a manner that the rear end of the inner tubular body Pb is welded to or is brought into contact with the rear end portion P2.

According to the inspection jig 3a, like the inspection jig 3, the rear end portion P2, which has a flat face, is in surface-contact with the electrode 34a. Therefore, the inspection jig 3a is superior to that described in the BACKGROUND section due to an increase of the contact area.

It should be noted that the rear end portion P2 of the outer tubular body Pa is not limited to a sealed flat face. The rear end portion P2 may be a ring-shaped end face of a tube.

In the foregoing non-limiting aspects of the disclosure, each outer tubular body Pa includes, as an outer spring part, the outer first spring part SO1 and the outer second spring part SO2. Alternatively, the outer tubular body Pa may include one outer spring part or may include three or more outer spring parts. In addition, these outer spring parts may be wound helically in the same direction. In the foregoing non-limiting aspects of the disclosure, each inner tubular body Pb includes, as an inner spring part, the inner first spring part SI1 and the inner second spring part SI2. Alternatively, the inner tubular body Pb may include one inner spring part or may include three or more inner spring parts. In addition, these inner spring parts may be wound helically in the same direction. Moreover, the outer spring parts and the inner spring parts may also be wound helically in the same direction.

As to the outer spring parts and the inner spring parts, the number of turns is not limited. For example, the number of turns may be appropriately set in relation to the amount of protrusion and elastic force of each probe Pr. As to the outer spring parts and the inner spring parts, the number of turns may be small from the viewpoint of a reduction in an inductance component of each probe Pr.

The support member 31 does not necessarily include the protrusion portions 31e.

In summary, an inspection jig according to a non-limiting aspect of the present disclosure may include: an electrode to be electrically connected to an inspection processing portion configured to electrically inspect a target object to be inspected; a probe formed in a substantially rod shape, the probe having a rear end portion to be brought into contact with the electrode, and a tip portion to be brought into contact with an inspection point on the target object; and a support member supporting the probe. In the inspection jig, the probe may include: an outer tubular body having a tubular shape and that is electrically conductive; and an inner tubular body having a tubular shape and that is electrically conductive, the inner tubular body being inserted into the outer tubular body. The outer tubular body includes an outer spring part configured to expand and contract along an axis of the outer tubular body and configured to bias the rear end portion. The inner tubular body includes an inner spring part configured to expand and contract along an axis of the inner tubular body. The tip portion is a first end of the inner tubular body, and protrudes from a first end of the outer tubular body. The support member holds the outer tubular body such that the rear end portion is brought into contact with the electrode by a biasing force of the outer spring part.

With this configuration, the outer spring part of the outer tubular body brings the rear end portion of the probe into press-contact with the electrode, and the inner spring part of the inner tubular body brings the tip portion of the probe into press-contact with the inspection point. In the inspection jig, consequently, the spring for press-contact of the probe with the electrode is different from the spring for press-contact of the probe with the inspection point in inspection. Therefore, this configuration reduces variations in pressure by press-contact of the probe with the electrode, the pressure being generated at the instant when the probe is brought into contact with the inspection point in inspection. This configuration accordingly facilitates improvement in contact stability of the probe.

The probe may further include a central conductor having a rod shape and that is electrically conductive, the central conductor being inserted into the inner tubular body. The rear end portion may be a first end of the central conductor, and may protrude from a second end of the inner tubular body, the second end being opposite to the tip portion that is the first end of the inner tubular body. The central conductor may be connected to the inner tubular body at a position closer to the rear end portion than the inner spring part of the inner tubular body is.

With this configuration, the central conductor guides the axial expansion and contraction of each of the outer tubular body Pa and the inner tubular body Pb. In addition, the first end of the central conductor having a rod shape corresponds to the rear end portion of the probe, and is brought into contact with the electrode. This configuration increases a contact area as compared with a configuration in which an end face of a tube is in contact with an electrode, and improves stability in contact of the probe with the electrode.

The rear end portion may be a second end of the outer tubular body. The outer tubular body and the inner tubular body may be connected to each other at a position closer to the rear end portion than the outer spring part of the outer tubular body and at a position closer to the rear end portion than the inner spring part of the inner tubular body.

With this configuration, the second end of the outer tubular body corresponds to the rear end portion of the probe, and is brought into contact with the electrode. Therefore, this configuration eliminates the necessity of the central conductor, and is thus simplified.

The electrode may have a substantially flat face to be brought into contact with the rear end portion. The rear end portion may have a flat face to be brought into contact with the electrode, the flat face being substantially flat and extending in a planar shape.

With this configuration, the rear end portion of the probe is made flat and is brought into surface-contact with the electrode. Therefore, this configuration increases a contact area, and improves stability in contact of the probe with the electrode.

The target object may have a target object surface being substantially flat. The inspection point may protrude from the target surface. The support member may have: an opposed surface disposed opposite the target object surface; and a protrusion portion protruding from the opposed surface to interfere with the target object surface. The tip portion may protrude from an opening in the opposed surface. The protrusion portion may protrude from the opposed surface by a length shorter than a sum of a length of the tip portion protruding from the opposed surface and a length of the inspection point protruding from the target object surface.

With this configuration, in bringing the inspection jig into contact with the target object in order to inspect the target object, the protrusion portion interferes with the target object surface before collision of the inspection point with the opposed surface of the inspection jig. This configuration reduces a possibility of damage to the inspection point due to the collision of the inspection point with the opposed surface of the inspection jig.

An inspection device according to another non-limiting aspect of the present disclosure includes: the inspection jig described above; and the inspection processing portion configured to inspect the target object, based on an electric signal from the electrode.

This configuration reduces variations in pressure by press-contact of the probe with the electrode, the pressure being generated at the instant when the probe is brought into contact with the inspection point in inspection. This configuration also facilitates improvement in contact stability of the probe.

REFERENCE SIGNS LIST

1: board inspection device (inspection device)
3, 3a, 3U, 3D: inspection jig
4, 4a, 4U, 4D: inspection portion
6: board fixing device
8: inspection processing portion
31: support member
31a, 31b, 31c: support plate
31e: protrusion portion
34: wire
34a: electrode
35: IC socket
100: board (target object)
101: semiconductor element (target object)
101a: target object surface
321: base plate
BP: bump (inspection point)
C: connection point
Cf: opposed surface
H: through hole
Ha: hole portion
Ha1: decreased diameter portion
Hb: narrow portion
Hc: rear end-side opening portion
P1: tip portion
P2: rear end portion
Pa: outer tubular body
Pb: inner tubular body
Pc: central conductor
Pc1: central conductor main body portion
Pc2: central conductor increased diameter portion Pp: protrusion portion
Pr: probe
SI1: inner first spring part (inner spring part)
SI2: inner second spring part (inner spring part)
SO1: outer first spring part (outer spring part)
SO2: outer second spring part (outer spring part)

The invention claimed is:

1. An inspection jig comprising:
an electrode configured to be electrically connected to an inspection processing portion, the inspection processing portion configured to electrically inspect a target object;
a probe substantially having a rod shape, the probe comprising:
a rear end portion configured to be brought into contact with the electrode, and
a tip portion configured to be brought into contact with an inspection point on the target object; and
a support member supporting the probe,
wherein
the probe comprises:
an outer tubular body that is electrically conductive; and
an inner tubular body that is electrically conductive, the inner tubular body being inserted into the outer tubular body,
the outer tubular body comprises an outer spring part configured to expand and contract along an axis of the outer tubular body and configured to bias the rear end portion toward the electrode,
the inner tubular body comprises an inner spring part configured to expand and contract along an axis of the inner tubular body,
the tip portion is a first end of the inner tubular body, and protrudes from a first end of the outer tubular body, and
the support member holds the outer tubular body such that the rear end portion is brought into contact with the electrode by a biasing force of the outer spring part,
wherein the probe further comprises:
a central conductor having a rod shape and that is electrically conductive, and
the central conductor being inserted into the inner tubular body, wherein
the rear end portion is a first end of the central conductor, and protrudes from a second end of the inner tubular body, the second end being opposite to the tip portion that is the first end of the inner tubular body, and
the central conductor is connected to the inner tubular body at a position closer to the rear end portion than the inner spring part of the inner tubular body.

2. The inspection jig according to claim 1, wherein
the rear end portion is a second end of the outer tubular body, and
the outer tubular body and the inner tubular body are connected to each other at a position closer to the rear end portion than the outer spring part of the outer tubular body and at a position closer to the rear end portion than the inner spring part of the inner tubular body.

3. The inspection jig according to claim 1, wherein
the electrode has a substantially flat face configured to be brought into contact with the rear end portion, and
the rear end portion has a flat face configured to be brought into contact with the electrode, the flat face being substantially flat and extending in a planar shape.

4. The inspection jig according to claim 1, wherein
the target object has a target object surface being substantially flat,
the inspection point protrudes from the target object surface,
the support member comprises:
an opposed surface disposed opposite the target object surface; and
a protrusion portion protruding from the opposed surface to interfere with the target object surface,
the tip portion protrudes from an opening in the opposed surface, and
the protrusion portion protrudes from the opposed surface by a length shorter than a sum of a length of the tip portion protruding from the opposed surface and a length of the inspection point protruding from the target object surface.

5. An inspection device comprising:
the inspection jig according to claim 1; and
the inspection processing portion configured to inspect the target object, based on an electric signal from the electrode.

6. The inspection jig according to claim 1, wherein the inner spring part is recessed within the outer tubular body.

7. A probe substantially having a rod shape, comprising:
a tip portion configured to be brought into contact with an inspection point on a target object;
a rear end portion configured to be the opposite side of the tip portion;
an outer tubular body that is electrically conductive;
an inner tubular body that is electrically conductive; and
a central conductor having a rod shape and that is electrically conductive,
wherein,
the inner tubular body is inserted in the outer tubular body,
the outer tubular body comprises an outer spring part configured to expand and contract along an axis of the outer tubular body and configured to bias the rear end portion,
the inner tubular body comprises an inner spring part configured to expand and contract along an axis of the inner tubular body,
the tip portion is a first end of the inner tubular body, and protrudes from a first end of the outer tubular body,
the central conductor being inserted into the inner tubular body, and
wherein
the rear end portion is a first end of the central conductor, and protrudes from a second end of the inner tubular body, the second end being opposite to the tip portion that is the first end of the inner tubular body, and
the central conductor is connected to the inner tubular body at a position closer to the rear end portion than the inner spring part of the inner tubular body.

8. The probe according to claim 7, wherein
the rear end portion is a second end of the outer tubular body, and
the outer tubular body and the inner tubular body are connected to each other at a position closer to the rear end portion than the outer spring part of the outer tubular body and at a position closer to the rear end portion than the inner spring part of the inner tubular body.

9. The probe according to claim 7, wherein
the outer spring part comprises an outer first spring part and an outer second spring part, the inner spring part comprises an inner first spring part and an inner second spring part, the outer first spring part and the outer second spring part are wound in opposite directions, and are substantially equal in number of turns to each other, the inner first spring part and the inner second spring part are wound in opposite directions, and are substantially equal in number of turns to each other, the outer first spring part and the inner first spring part are disposed facing each other, are substantially equal in number of turns to each other, and are wound in opposite directions, the outer second spring part and the inner second spring part are disposed facing each other, are substantially equal in number of turns to each other, and are wound in opposite directions.

10. An inspection jig comprising:

an electrode configured to be electrically connected to an inspection processing portion, the inspection processing portion configured to electrically inspect a target object;

a probe substantially having a rod shape, the probe comprising:

a rear end portion configured to be brought into contact with the electrode, and     a tip portion configured to be brought into contact with an inspection point on the target object; and a support member supporting the probe, wherein     the probe comprises:

an outer tubular body that is electrically conductive; and         an inner tubular body that is electrically conductive, the inner tubular body being inserted into the outer tubular body,     the outer tubular body comprises an outer spring part configured to expand and contract along an axis of the outer tubular body and configured to bias the rear end portion toward the electrode,     the inner tubular body comprises an inner spring part configured to expand and contract along an axis of the inner tubular body,     the tip portion is a first end of the inner tubular body, and protrudes from a first end of the outer tubular body, and     the support member holds the outer tubular body such that the rear end portion is brought into contact with the electrode by a biasing force of the outer spring part, wherein     the rear end portion is a second end of the outer tubular body, and     the outer tubular body and the inner tubular body are connected to each other at a position closer to the rear end portion than the outer spring part of the outer tubular body and at a position closer to the rear end portion than the inner spring part of the inner tubular body.

11. The inspection jig according to claim 10, wherein the electrode has a substantially flat face configured to be brought into contact with the rear end portion, and the rear end portion has a flat face configured to be brought into contact with the electrode, the flat face being substantially flat and extending in a planar shape.

12. The inspection jig according to claim 10, wherein the target object has a target object surface being substantially flat, the inspection point protrudes from the target object surface, the support member comprises:

an opposed surface disposed opposite the target object surface; and     a protrusion portion protruding from the opposed surface to interfere with the target object surface, the tip portion protrudes from an opening in the opposed surface, and the protrusion portion protrudes from the opposed surface by a length shorter than a sum of a length of the tip portion protruding from the opposed surface and a length of the inspection point protruding from the target object surface.

13. An inspection device comprising:

the inspection jig according to claim 10; and the inspection processing portion configured to inspect the target object, based on an electric signal from the electrode.

\* \* \* \* \*